United States Patent [19]

Spitsin et al.

[11] Patent Number: 5,160,592
[45] Date of Patent: Nov. 3, 1992

[54] METHOD FOR TREATMENT OF MOVING SUBSTRATE BY ELECTRIC DISCHARGE PLASMA AND DEVICE THEREFOR

[75] Inventors: Valentin M. Spitsin; Evgeny V. Karetnikov; Sergei F. Grishin; Andrei A. Ivanov; Boris L. Gorberg, all of Ivanovo, U.S.S.R.

[73] Assignee: Ivanovsky Nauchno-Issledovatelsky Experimentalno-Konstruktorsky Institut, Ivanovo, U.S.S.R.

[21] Appl. No.: 708,455

[22] Filed: May 31, 1991

[51] Int. Cl.$^5$ .................. B01J 19/08; B05D 3/14; H05F 3/04
[52] U.S. Cl. .................. 204/164; 204/165; 422/186.05; 422/186.21; 427/538
[58] Field of Search ............. 204/164, 165, 168; 427/40; 422/186.05, 186.21

[56] References Cited

U.S. PATENT DOCUMENTS

| 3,281,347 | 10/1966 | Winder | 422/186.05 |
| 3,369,981 | 2/1968 | Levaux | 422/186.21 |
| 3,632,299 | 1/1972 | Thorsen | 204/165 |
| 3,959,104 | 5/1976 | Fales | 204/165 |
| 4,472,467 | 9/1984 | Tamaki et al. | 427/40 |

Primary Examiner—John Niebling
Assistant Examiner—Brian M. Bolam
Attorney, Agent, or Firm—Ladas & Parry

[57] ABSTRACT

According to the proposed method a moving substrate is transported through a plurality of zones of treatment by plasma flows, arranged parallel to the moving substrate. Plasma flows are produced in each treatment zone in individual regions, a plasma-forming gas being supplied into the gaps between the adjacent regions and directed to the surface of the moving substrate. These gaps between adjacent regions are produced by electric potentials, equal in magnitude and similar in polarity, of electrodes used to generate plasma flows of adjacent regions. In a device realizing the method, pairs of electrodes used to form individual treatment regions are arranged so that any two adjacent pairs have their like electrodes facing each other, plasma-forming gas feed nozzles being fit in the gaps between said electrodes.

3 Claims, 2 Drawing Sheets

METHOD FOR TREATMENT OF MOVING SUBSTRATE BY ELECTRIC DISCHARGE PLASMA AND DEVICE THEREFOR

FIELD OF THE IVVENTION

This invention relates to textile industry and, more particularly, to a method of treatment of a moving substrate (cloth or warp) by discharge plasma and a device realizing this method. This invention can be successfully used for the treatment of great lengths of textile materials and in other branches of industry for the treatment of films, artificial and natural leather materials.

PRIOR ART

Known in the art is a method for treatment of a moving substrate by discharge plasma, which consists in that the substrate, e.g. moving cloth, is passed through plasma produced between the electrical potentials of different polarities, the plasma flow should at all times be directed perpendicularly to the direction of movement of the substrate (U.S. Pat. No. 3,632,299).

This method is deficient in that this direction of movement of the substrate through the plasma flow results in instability of treatment of textile materials, which is attributed to unstable and anisothropic electrical properties of the fabric. As a result, the plasma characteristics change quite substantially as the substrate moves and disrupts the electrical connection between the electrodes between which the substrate is passed.

Also known in the art is a method for treatment of a moving substrate by discharge plasma, which consists in that a substrate continously moving in vacuum is passed in a loop-like manner through a plurality of plasma treatment zones, the flow of plasma being predominantly parallel to the direction of movement of the substrate (U.S. Pat. No. 3,959,104). The plasma flow is uninterrupted in each zone. With the plasma flow being continuous and directed parallel to the direction of movement of the substrate, the electrical properties of the substrate are no longer affecting the characteristics of plasma and it is burning very stably. But this method is deficient in that the surface of the substrate, being under the action of plasma, starts releasing decomposition products which are extremely difficult to remove considering the high vacuum of the chamber and which are deposited on the substrate throughout the treatment zone, distorting the chemical composition of the plasma-forming gas directly in the treatment zone. This distortion of the chemical composition of plasma results in slowing down of the reactions and upsetting the technological treatment process.

The above method is realized in a device comprising a reactor (reservoir) equipped with evacuation systems and a means for feeding a plasma-forming gas, made as a pipeline connecting the reactor and the plasma-forming gas source, a power source, and a system of tubular electrodes electrically connected to the latter and mounted inside the reactor successively one after another in parallel rows along the direction of movement of the substrate being treated. The electrodes arranged in rows form zones of substrate treatment by a plasma flow generated between pairs of electrodes of different polarities. The electrodes in vertical rows have their polarities alternating so that the plasma flows produced therebetween are uninterrupted throughout the length of each treatment zone. The monotonous alternation of electrode pararities in each treatment zone produces a continuous flow of plasma which prevents the plasma-forming gas from penetrating to the surface of the moving substrate. As a result, decomposition products accumulate near the surface of the substrate and disturb the chemical composition of plasma and, consequently, disrupt the technological treatment process. In case any foreign body is placed, to facilitate the removal of decomposition products from the surface of the subtrate, in the gap between the electrodes of opposite polarities, the discharge becomes irregular and plasma flows unstable.

SUMMARY OF THE INVENTION

The object of this invention is to make treatment of a moving substrate by discharge plasma more effective.

Another object of the invention is to improve the efficiency of treatment.

One more object of the invention is to improve the quality of substrate treatment.

This is accomplished by that in a method for treatment of a moving substrate by discharge plasma, consisting in that the substrate is continuously moving in vacuum and directed in a loop-like manner through a plurality of zones of treatment by plasma flows, in each zone said plasma flows being produced parallel to the moving substrate, according to the invention, in each treatment zone a plasma flow is produced in the form of separate regions, a plasma-forming gas being fed into the gaps between adjacent regions of plasma and directed to the surface of the moving substrate.

It is advisable that the gaps between adjacent plasma regions should be produced by electrode potentials which are equal in magnitude and polarity and are used to form plasma flows of adjacent regions.

Since individual regions of plasma flows are produced in each treatment zone, a plasma-forming gas can be supplied between said regions to the surface of a moving substrate without disturbing the plasma forming process. In this arrangement, the plasma-forming gas "washes" decomposition products away from the surface of the substrate. The chemical composition of plasma reacting with the solid substance of the substrate is optimized within a certain location and the reaction quality and speed is substantially improved. The restriction of adjacent plasma regions by electric potentials, which are equal in magnitude and polarity for a specific region with the glow gas discharge directed parallel to the substrate, limits the zones where no discharge is available and prevents destabilization of plasma.

The herein disclosed method can be realized in a device comprising a reactor equipped with a vacuum system and a plasma-forming gas supply means, a system for transportation of the treated substrate, a power source, and a system of tubular electrodes, which is electrically connected to said power source, the electrodes being arranged inside the reactor in parallel rows along the direction of the substrate movement to form treatment zones of plasma flows produced between pairs of electrodes having opposite polarity. The device according to the invention is provided with electrode pairs arranged with gaps in each treatment zone so that any two adjacent pairs have their electrodes of the like polarity facing each other. The plasma-forming gas supply means comprises nozzles placed in the gaps between the electrodes of the like polarity of the adjacent pairs. This arrangement permits realization of the proposed method and purposeful application of the plasmaforming gas, which improves the efficiency of treatment and saves time and expenditures for treatment.

BRIEF DESCRIPTION OF THE DRAWINGS

The invention will now be described in greater detail with reference to various specific embodiments thereof, taken in conjunction with the accompanying drawings, in which.

DETAILED DESCRIPTION OF THE PREFERRED EMBODIMENTS

The method of teeatment of a moving substrate by electric discharge plasma is realized as follows.

Figure 1:
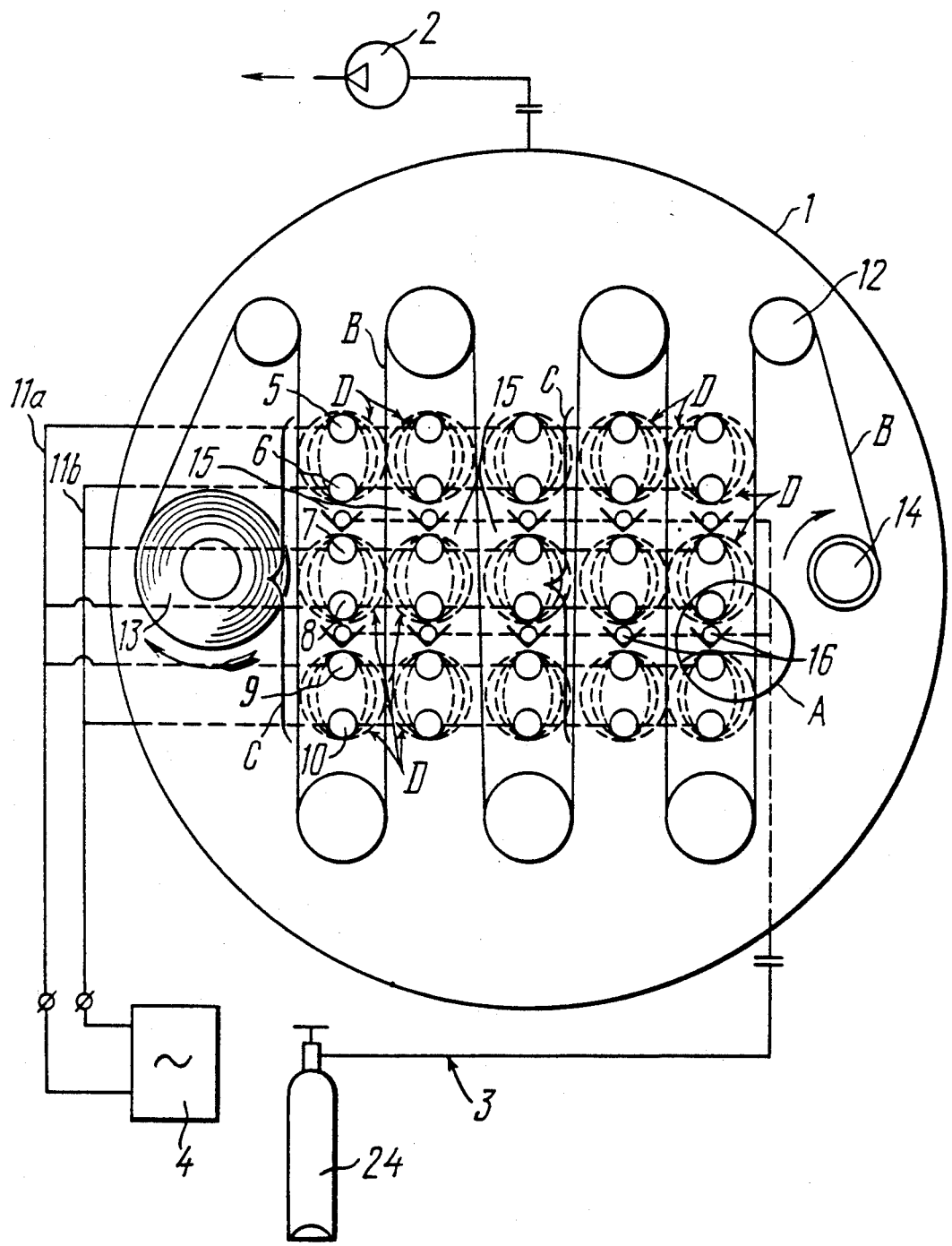
FIG. 1 shows a schematic of a device for treatment of a moving substrate by electric discharge plasma, realizing the proposed method therefor.

A continuously moving substrate B, e.g. textile fabric, is transported loop-like, as shown in FIG. 1, through a plurality of zones C of treatment by plasma flows. In each treatment zone C plasma flows are produced parallel to the moving substrate B by electric discharge of the plasma-forming gas between the electrodes of opposite polarity. The plasma flows are produced as individual regions D with gaps therebetween. These plasma regions D are arranged across the total width of the substrate. The boundaries of the adjacent regions D or the gaps between them are produced by electric potentials of electordes, which are equal in magnitude and have the like polarity, the same electrodes being used to form plasma flows of adjacent regions D. In case of alternating current, the potentials of the boundaries vary in phase. The plasma-forming gas (oxygen, air, nitrogen, argon, and the like) is blown into the gaps at an acute angle to the substrate surface; the type of the plasma-forming gas depends on the type of treatment, for which a specific composition of plasma is to be maintained. The substrate is subjected to treatment by plasma of a specific composition. Decomposition products are continuously "blown away", by the plasma-forming gas from the substrate surface and removed by the operating evacuation pump. As a result, the treatment of the substrate is performed in a clean plasma, which makes it possible to achieve a more through plasma treatment and to speed up the process.

Since the plasma-forming gas is introduced into the gaps where, due to the like and equal potentials, the boundaries of each region D are distinct and no discharge is available, the possibility of a situation where plasma generation could be disrupted or unstable is totally eliminated. Plasma between the potentials of electrodes of each region is stable and burns with a constant chemical composition. The plasma-forming gas always has time enough to level off in the flow and over the substrate surface to remove, as it progresses, decomposition products therefrom.

In the examples below the proposed method was realized in the following conditions:

Pressure of the plasma-forming gas 80–90 Pa.

Amount of plasma-forming gas supplied 100 cm$^3$/sec;

The plasma-forming systems were equipped with tubular electrodes with a diameter of 40 mm and 1600 mm long; these electrodes were arranged across the width of the substrate in vertical rows between which the substrate was transported in a loop-like path, which makes it possible to treat both sides of the substrate at the same time; electrode axes spaced 80 mm apart horizontally and 110 mm apart vertically; electric current of 52A was supplied to electrodes with a voltage between electrode of 480–540 V, the input power being 25–28 kWt.

EXAMPLES OF REALIZATION OF THE METHOD

Example 1

Treatment of pure wool fabric with surface density of 118 g/m$^2$, warp and weft-95% wool and 5% polyamide, width 142±2 cm. The object of treatment to decrease its tendency to felting (making the fabric resistant to felting). The plasma-forming gas was air. Initial humidity of the fabric about 2%. The treatment was pefformed by two methods:

according to the proposed method with air fed between plasma regions;

according to the prior art method when air is fed to the reactor by a conventional method, that is directly to the reactor and plasma is produced continuously without gaps.

The output capacity and dimensions of the electrode systems was the same for both methods. The optimal treatment period for the first method was 5.06 seconds and 7.60 seconds for the second method. The gain in efficiency was thus 1.502. The optimal treatment period is the time of treatment in which the shrinkage due to felting is minimal. In this example, when the first method was used, the shrinkage was 6.5% of the area (38% of the untreated fabric).

EXAMPLE 2

Subjected to treatment was semiwoolen fabric: surface density 203−10 g/m$^2$, width 142±2 cm, warp and weft—35% wool, 54% viscose, 11% polyamide fiber; inital humidity 2.3%. Antifelting treatment. The plasma-forming gas was air. The above two methods were used for treatment. Results of the first method—4.9 sec., second method—7.31 sec. The efficiency gain factor 1.495. Shrinkage due to felting was 9.2% in the first method and 9.4% in the second one (55% of the original fabric).

EXAMPLE 3

Subjected to treatment was semiwoolen fabric with surface density of 152−8 g/cm$^2$, width 142±2 cm, warp and weft with 65% wool and 35% viscose, and initial humidity of 1.2.1%.

Antifelting treatment and partial hydrophilization. The plasma-forming gas was oxygen.

Results: first method—6.51 sec, second method—11.8 sec. The efficiency gain factor of 1.810 was achieved.

EXAMPLE 4

The material treated was nonwoven knitted-sewn wool tows and regenerated wool "fleecy jersy fabric" with the surface density of 400 g/cm$^2$. Shrinkage due to felting of the original material was 60%. Antifelting treatment was like in Example 1.

Results: in the first method—shrinkage due to felting was 10.38%, in the second method—16%.

EXAMPLE 5

The material treated was fluoride lacquer fabric made from fluoroplastic. The treatment procedure was as in Example 1. The treatment period by the first method was 1 second and 8 sec. in the secon—method. The wetting angle changes from 102° to 90°-92° in the prior art method and 67°-70° in the proposed method. The separation effort for two strips of the treated fabric increases, respectively, to 0.16 and 0.24 kgf/cm from the initial 0.01 kgf/cm.

EXAMPLE 6

Subjected to treatment was cotton cloth with the original capillarity equal to 0 (crude fabric). Treatment time was 30 seconds. The after-treatment capillarity was 123 mm/h in the prior art method and 151 mm/h in the proposed method.

EXAMPLE 7

The treated material was polyester technical warp, the plasma-forming gas was nitrogen. After treatment the warp was rubberized and the rubber-warp adhesion was measured. The increase in adhesion, as contrasted to the prior art method, was 2.1.

To sum up, various types of fabrics teated by the method according to the invention acquire more pronouced properties due to the elimination of the parasitic gas sheath consisting of decomposition gases produced during treatment. This result is universal for all known substrates and treatment processes, apart from those where the treatment is supposed to make use of decomposition gases as a part of plasma.

A device realizing the above method of treatment of of a moving substrate by electric discharge plasma comprises a vacuum reactor 1 equipped with an evacuation system 2 and a means 3 for feeding a plasma-forming gas, a power source 4 (an ultrasonic frequency electric generator), and a system of tubular electrodes 5,6,7,8,9,10 (indicated are only electrodes of one row). These electrodes are arranged inside the reactor 1 successively, one after another, in parallel rows along the direction of movement of a substrate B. The rows are vertical. The first, along the substrate B movement, row comprises electrodes 5,6,7,8,9,10. Next comes a second row of parallel electrodes, and so on, thus forming a treatment zone C. All electrodes are connected into two groups 11a and 11b isolated from each other. One group is connected to a positive pole of the power source 4 and the other to the negative one. The reactor 4 is also equipped with a system for transportation of the substrate B being treated, which comprises freely rotating rollers 12 driven by the substrate rewinding from a roll 13 to a roll 14 arranged inside the reactor 1 on different sides of the treatment zones, as shown in FIG. 1.

The electrodes of groups 11a and 11b, in each treatment zone C, are set in pairs 5-6, 7-8, 9-10, each pair including electrodes of opposite polarities, that is connected to opposite poles of the power source 4. Therefore, the electrodes 5,8,9 are connected, for example, to a positive pole, whereas electrodes 6,7, 10-to the negative one, which guarantees a stable burning of plasma. In each treatment zone C, the pairs of electrodes are placed so that any two adjacent pairs have their like electrodes facing each other. As a result, plasma in each treatment zone C burns in regions D with gaps 15 between adjacent regions.

Figure 2:
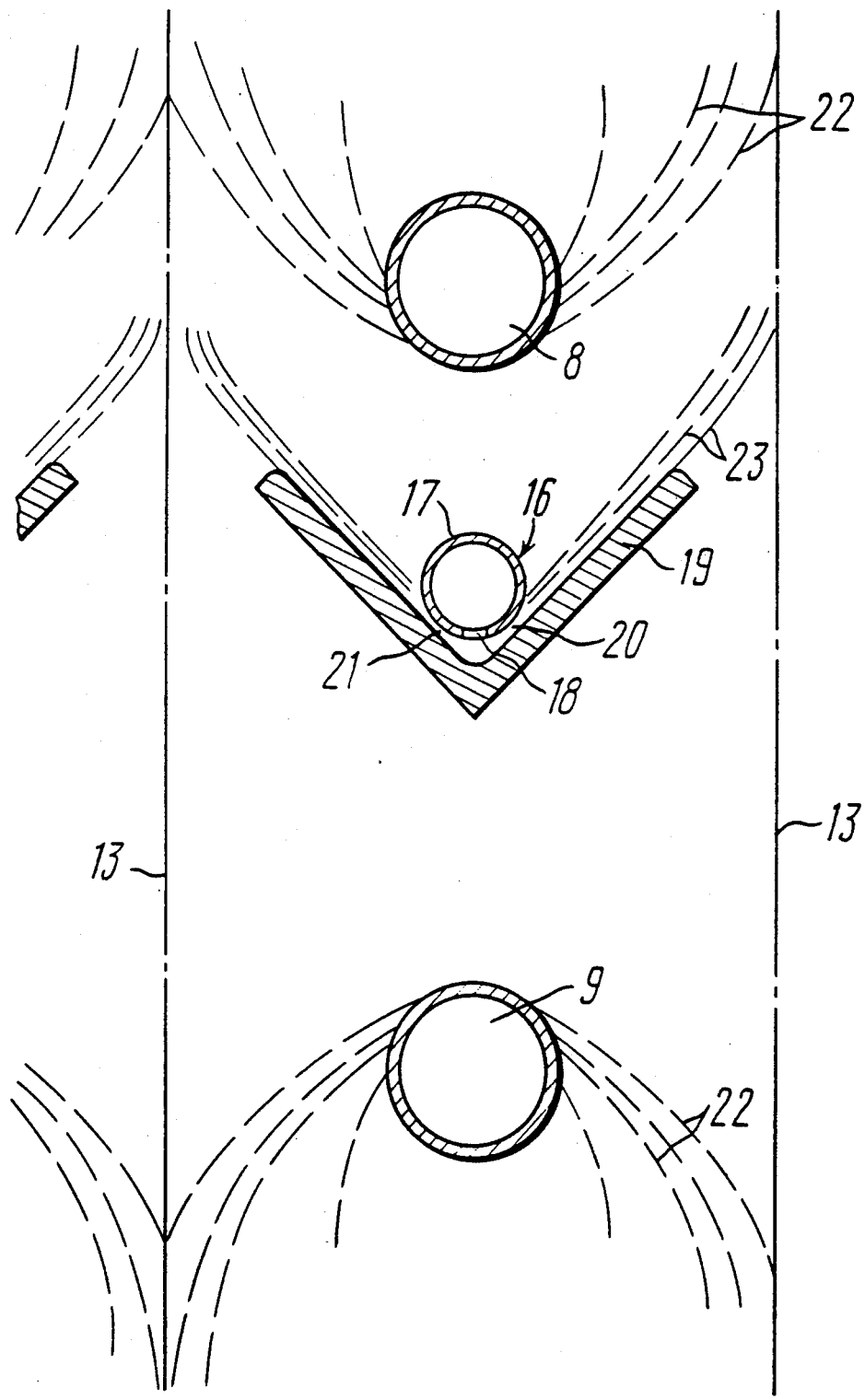
FIG. 2 shows an enlarged view of a unit A of FIG. 1.

The plasma-forming gas feeding means 3 comprises nozzles 16 placed in gaps 15 between like electrodes of adjacent pairs in each treatment zone C. Referring to FIG. 2, the nozzle 16 comprises a pipe 17 having perforations 18 in the lower portion thereof and an angle piece 19. This angle piece 19 forms, in combination with the pipe 17, gaps 20 and 21 on both sides. These gaps 20 and 21 are extremely small and are, in fact, the direction control device of the nozzle. The availability of the gaps 20 and 21 makes it unnecessary to provide very thin perforations 18 in the pipe 17. Lines 22 indicate the direction of electric current in plasma, while lines 23 indicate the flows of the plasma-forming gas fed to the moving substrate B. The angle between the direction of movement of the substrate B and the gas flow direction may vary, for example in can be 135° or 45° but excluding the angles from 60° to 120° As too acute angles for the gas stream to hit the substrate. Except this for bidden range of acute angles, all other angles are permissible. Too acute angles result in a substrntially higher plasma-forming gas expenditure.

A source 24 (FIG. 1) of the plasma-forming gas may be a bottle with a specific gas or an air intake.

The device realizing the method according to the invention operates as follows.

The material to be treated, which is referred to as a substrate (fabric, nonwoven material, film, and the like), is rewound from the roll 13 to 14 by a transport system. As this goes on, the substrate B is passed in a loop-like path through treatment zones C between the rows of electrodes 5-10. The reactor 1 is hermetically sealed and the vacuum system 2 maintains a 100 Pa vacuum therein (or some other level of vacuum depending on the treatment process).

The power source 4 supplied an ultrasonic frequency electric voltage to the electrodes 5-10. A glow gas discharge (indicated by dash lines extending from electrodes in the drawing) is produced between adjacent electrodes belonging to different groups 11a and 11b and, as a consequence, plasma flows are generated in individual regions D. Plasma treatment of the fabric may be performed to achieve different purposes depending on the type of the plasma-forming gas. The plasma treatment of a solid substrate initiates an intensive isolation of decomposition gases therefrom (ocides, water vapours, products of pigment decomposition, and the like). These decomposition gases envelop the substrate surface and are i an obstacle to the required plasma treatment.

In order to prevent this, the plasma-forming gas fed from the source 24 of the means 3 is supplied to the nozzles 16 and directly to the substrate to expulse and displace the decomposition gases. The nozzles 16 are arranged in the gaps 15 between the electrodes of one group (of the like polarity) and cannot, therefore, be the reason of the discharge disruption, since no difference in potential is available between the electrodes of one group and no discharge is possible.

A substrate is treated in the environment of plasma of the pure plasma-forming gas whose consumption is minimal. This permits a better quality and shorter period of treatment and, in addition, saves the plasma-forming gas, which is a substantial reduction of expenditures for the substrate treatment.

The herein disclosed invention can help drastically reduce the dimensions of the electrode system in the plasma chemical reactors, make them more efficient, and opens the way to providing small-size single-reactor devices where rolls with fabric or film are arranged alongside with the electrode system.

What is claimed is:

1. A method for treatment of a moving substrate by electric discharge plasma, comprising the steps of continuously moving the substrate, producing a plurality of zones of treatment by plasma flows along said moving substrate, said substrate moving through said zones in a loop-like fashion; producing plasma flows in each said treatment zone parallel to said moving substrate as individual regions with gaps therebetween; supplying a plasma-forming gas into said gaps between adjacent regions of plasma flows in each said treatment zone, said plasma-forming gas being directed to the surface of said moving substrate.

2. A method of treatment of a moving substrate by electric discharge plasma, as claimed in claim 1, wherein regions of plasma flows are produced by potentials of electrodes having opposite polarities; the gaps between adjacent regions of plasma flows in each said treatment zone are produced by equal and like potentials of electrodes used to generate plasma flows in adjacent regions.

3. A device for treatment of a moving substrate by electric discharge plasma, comprising: a reactor for substrate treatment, having a vacuum system and a plasma-forming gas feed means; a system for transportation of the moving substrate inside said reactor; a system of tubular electrodes arranged in each said reactor in parallel rows along the direction of movement of the substrate; a power source who-e poles are connected to tubular electrodes which form zones of treatment of the moving substrate by plasma flows generated between pairs of electrodes having opposite polarities; pairs of electrodes in each zone of treatment of the moving substrate, producing plasma flows, being arranged so that gaps are provided between them and any two adjacent pairs have their like electrodes facing each other; said means for feeding a plasmaforming gas, comprising nozzles arranged in the gaps between electrodes of the like polarities of adjacent pairs.

* * * * *